United States Patent [19]
Van Driel et al.

[11] Patent Number: 5,969,525
[45] Date of Patent: Oct. 19, 1999

[54] MR IMAGING APPARATUS

[75] Inventors: Johannes C. A. Van Driel; Johannes J. Van Vaals, both of Eindhoven, Netherlands; Dietrich J. K. Holz, Ulzburg; Volker Rasche, Hamburg, both of Germany

[73] Assignee: U.S. Philips Corporation, New York, N.Y.

[21] Appl. No.: 08/878,363

[22] Filed: Jun. 18, 1997

[30] Foreign Application Priority Data

Jul. 1, 1996 [EP] European Pat. Off. ............... 96201828

[51] Int. Cl.⁶ ...................................................... G01V 3/00
[52] U.S. Cl. ........................... 324/318; 324/309; 324/307; 335/299
[58] Field of Search .................................... 324/318, 309, 324/319, 307, 300; 335/299

[56] References Cited

U.S. PATENT DOCUMENTS

| | | | |
|---|---|---|---|
| 4,825,162 | 4/1989 | Roemer et al. | 324/318 |
| 5,428,292 | 6/1995 | Dorri et al. | 324/319 |
| 5,498,961 | 3/1996 | Kuhn et al. | 324/309 |
| 5,525,905 | 6/1996 | Mohapatra et al. | 324/318 |
| 5,636,636 | 6/1997 | Kuhn et al. | 128/653 |

FOREIGN PATENT DOCUMENTS

| | | |
|---|---|---|
| 0679900A1 | 2/1995 | European Pat. Off. . |
| 0679900 | 11/1995 | European Pat. Off. . |

*Primary Examiner*—Christine Oda
*Assistant Examiner*—Brij B. Shrivastav
*Attorney, Agent, or Firm*—Dwight H. Renfrew

[57] ABSTRACT

MR imaging apparatus includes a magnet (1) for generating in an examination zone (3) a uniform, steady magnetic field having substantially parallel lines of force extending in a first direction (Z), a gradient coil system (5) for generating a magnetic gradient field, and an RF coil system for generating RF pulses and for receiving MR signals. The apparatus also includes devices (25,27,31) for generating data from the MR signals, and a reconstruction unit (39) for reconstructing an MR image of the examination zone (3) from a set of the data. A patient support system includes a table top (7) drive means (11) configured for displacement of the table top in the first direction (Z), and a connection (43) for coupling the drive means and the control unit (29). The magnet (1) has a generally toroidal-shaped housing (15) surrounding a bore (17) and has a longitudinal axis (19) extending substantially parallel to the first direction (Z). The housing (15) has a radial thickness (r) in a direction transverse to said axis (19) and a longitudinal thickness (1) in a direction substantially parallel to said axis, the radial thickness being greater than the longitudinal thickness.

9 Claims, 3 Drawing Sheets

MR IMAGING APPARATUS

BACKGROUND OF THE INVENTION

1. Field of the Invention

The invention relates to an MR apparatus for imaging of an examination zone, including a magnet for generating in the examination zone a uniform, steady magnetic field having substantially parallel lines of force extending in a first direction, a gradient coil system for generating a magnetic gradient field whose gradient can be varied in respect of magnitude and/or direction, an RF coil system for generating RF pulses and for receiving MR signals, means for generating data from the MR signals, a reconstruction unit for reconstructing an MR image of the examination zone from a set of the data, patient support means comprising a table top and drive means for displacement of the table top in said first direction, and means for coupling said drive means and said control unit.

2. Description of the Related Art

An example of an MR apparatus of this kind is disclosed in U.S. Pat. No. 5,498,961, incorporated herein by reference. This document describes an MR method for two-dimensional or three-dimensional imaging of the examination zone, said method being now generally known as helical scanning. In this method, in order to produce an image representing the examination zone at a selectable instant or in a selectable slice, a set of auxiliary data is formed from at least two sets of raw data, the auxiliary data being derived by interpolation from the raw data acquired with the same measurement parameters, but at different measurement instants, or derived for different measurement slices. The weight applied to the raw data entering the interpolation is greater as the distance in time between the associated measurement instant and the selectable instant, or between the measurement slice and the selected slice, is smaller. The image of the examination zone is reconstructed from the set of auxiliary data.

Consequently, in the helical scanning method the images of the examination zone are not reconstructed directly from the raw data, but from the auxiliary data derived from the raw data by interpolation. This interpolation takes into account the instants of measurement of the raw data (or the position of the measurement slice) as well as the selectable instant (or the position of the selected layer) for which an image of the examination zone is to be reconstructed. The temporal resolution can then be higher than the value corresponding to the measurement period required for acquisition of a set of raw data. The same holds for the spatial resolution in the direction of movement of a moving object.

Due to these features, the helical scanning method is suitable for examining an object which is moved relative to the examination zone during the examination. In that case, sets of raw data are continuously measured during the movement, at least one set of auxiliary data being formed from said raw data, a respective MR image being reconstructed from said auxiliary data. This enables the formation of a sequence of cross-sectional images of the body already during the introduction of the (patient's) body into the examination zone, the spatial resolution in the movement direction already having been improved. The apparatus referred to above is particularly suitable for carrying out this version of the helical scanning method.

SUMMARY OF THE INVENTION

It is an object of the invention to provide an apparatus of the kind set forth with which it is possible to make an even better use of the possibilities created by the known techniques for forming a sequence of cross-sectional images of an object during movement of this object through the examination zone, such as helical scanning technique. To achieve this object, the MR apparatus in accordance with the invention is characterized in that the magnet comprises a generally toroidal-shaped housing surrounding a bore, said magnet having a longitudinal axis extending substantially parallel to said first direction, said housing having a radial thickness in a direction transverse to said axis and a longitudinal thickness in a direction substantially parallel to said axis, said radial thickness being greater than said longitudinal thickness. The apparatus in accordance with the invention is a very open system in which the patient to be examined is not enclosed in a long tunnel as in more conventional systems. As a result, the patient is accessible for additional examinations or treatment by medical staff. Moreover, the patient feels more comfortable in an open system because such a system does not cause claustrophobia. Similar advantages are obtained with previously proposed relatively open systems, but in these systems the magnetic field in the examination zone is significantly less uniform than in more conventional systems. As a result, the image quality obtainable with such systems is inferior. In the apparatus in accordance with the invention, the magnetic field in the bore of the magnet can be made as uniform as in a conventional magnet, be it that the homogeneity volume (the volume in which the field is uniform) has a relatively small dimension in the longitudinal direction. Because a scanning technique is used that allows the formation of a sequence of cross-sectional images of a moving patient, it is possible to obtain all raw data from the homogeneity volume and to reconstruct an image of the whole patient from these data. This image then has a quality as good as the quality of images obtained with a conventional apparatus.

An embodiment of the apparatus in accordance with the invention is characterized in that the magnetic field generated by the magnet is homogeneous in a substantially disc-shaped homogeneity volume having a longitudinal axis substantially coinciding with the longitudinal axis of said magnet, and having a diameter that is at least twice its longitudinal thickness. A disc-shaped homogeneity volume is sufficient for obtaining excellent quality images and it allows the magnet to have an extremely small longitudinal thickness. Preferably the diameter of the homogeneity volume is at least 40 cm, its longitudinal thickness being not more than 10 cm.

A further embodiment of the apparatus according to the invention is characterized in that the RF coil system comprises an array of surface coils for receiving MR signals, each surface coil overlapping at least a portion of at least one other surface coil, the array extending over a ring-shaped surface surrounding the longitudinal axis of the magnet. In this embodiment the RF coil system can be shaped as a very thin ribbon so that it can be accommodated in the bore of the magnet without necessitating a substantial enlargement of the radius of the bore.

A still further embodiment of the apparatus in accordance with the invention is characterized in that the drive means is further conceived for displacement of the table top in a direction substantially perpendicular to said first direction. This embodiment allows the use of cheaper or even more open magnets because the homogeneity volume may have a smaller radius than the bore. The patient can be moved in more than one direction so that each time raw data can be obtained from a part of the patient that is in the homogeneity volume. If required to prevent backfolding, zoomed imaging techniques such as LOLO can be applied.

These and other aspects of the invention will be apparent from and elucidated with reference to the embodiments shown in the drawing.

DETAILED DESCRIPTION OF THE PREFERRED EMBODIMENTS

Figure 1:
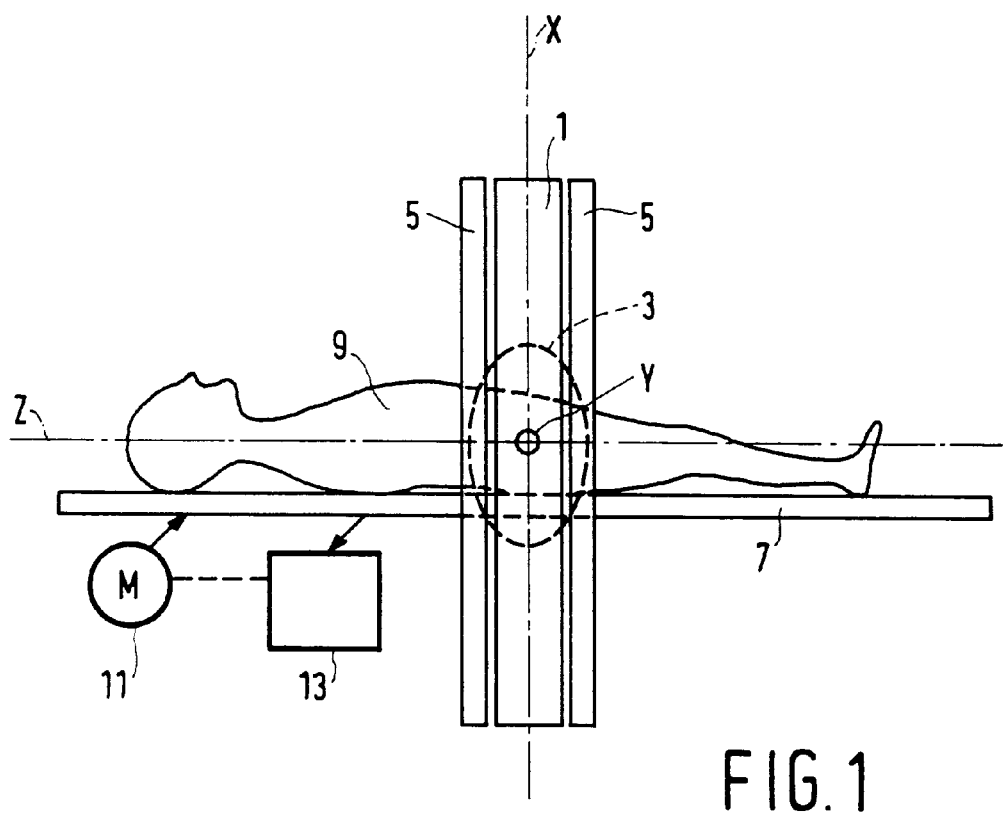
FIG. 1 schematically shows an embodiment of an MR apparatus in accordance with the invention.

The MR apparatus shown in FIG. 1 comprises a magnet 1 for generating a uniform, steady magnetic field in an examination zone 3 indicated with dotted lines. In the examination zone 3 the magnetic field has substantially parallel lines of force that extend in a first direction which corresponds to the Z-axis of a rectangular coordinate system. The apparatus also comprises a gradient coil system 5 for generating a magnetic gradient field whose gradient can be varied in respect of magnitude and/or direction. The gradient coil system 5 is known per se and therefore it is not shown in detail. Usually it comprises three sets of gradient coils for generating three gradient fields that all have lines of force extending in the Z-direction, the field strength of one of these gradient fields varying as a function of x, the field strength of a second gradient field varying as a function of y and the field strength of the third gradient field varying as a function of z. The three gradient fields are superimposed to form the magnetic gradient field referred to above. Preferably each of the three sets of coils that form the gradient coil system 5 is symmetrically arranged relative to the center of the examination zone 3 which coincides with the origin of the coordinate system. Therefore, the magnetic field strength at the center of the examination zone 3 is determined exclusively by the steady, uniform magnetic field of the magnet 1.

The apparatus further comprises patient support means comprising a table top 7 on which a patient 9 can be placed. Drive means (symbolized by a motor 11) are provided for displacement of the table top 7 in the Z-direction. In a further embodiment the drive means can also be conceived for displacement of the table top 7 in a second direction perpendicular to the Z-direction, for example the X-direction. The advantages of this modification will be explained later. The table top 7 and/or the drive means 11 may be coupled to a sensor 13 which supplies a signal corresponding to the position of the table top.

Figure 2:
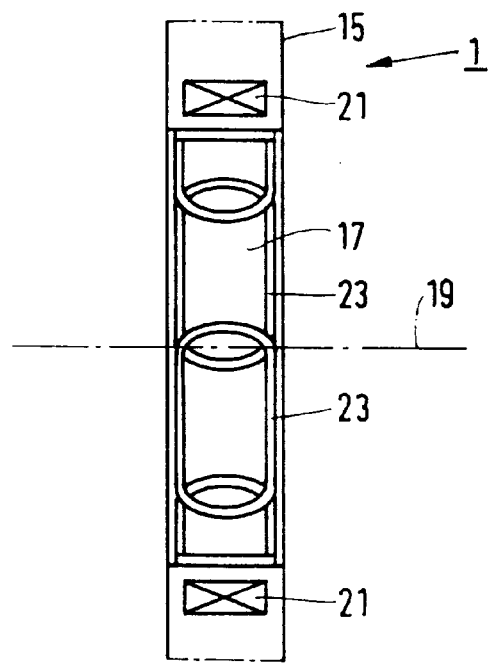
FIG. 2 shows a partial longitudinal section of a magnet for use in the apparatus shown in FIG. 1.
Figure 3:
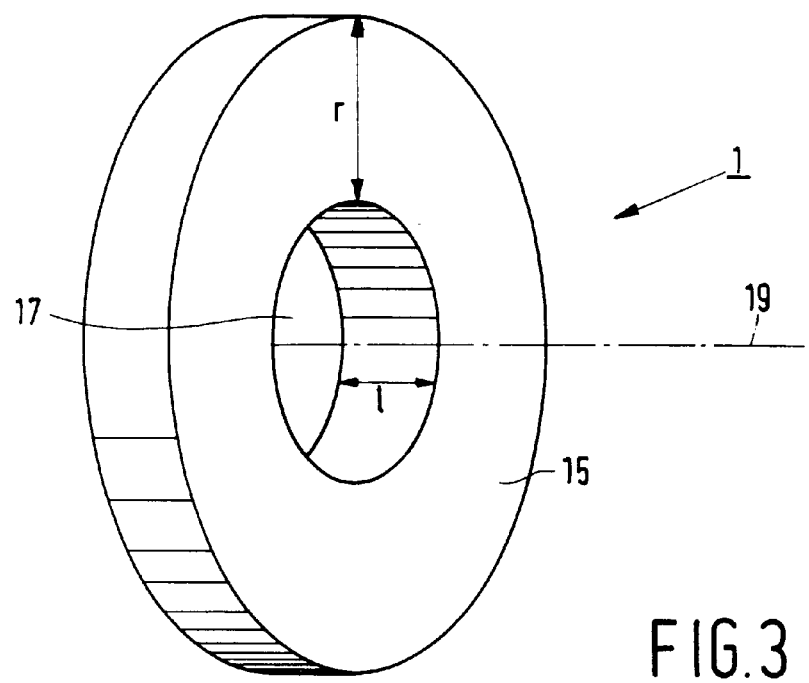
FIG. 3 shows a perspective view of the magnet shown in FIG. 2.

FIG. 2 shows a longitudinal section and FIG. 3 shows a perspective view of the magnet 1. This magnet comprises a generally toroidal-shaped housing 15 surrounding a bore 17. The magnet 1 has a longitudinal axis 19 which coincides with the Z-axis when the magnet is installed in the apparatus shown in FIG. 1. The housing 15 has a radial thickness r in a direction transverse to the longitudinal axis 19 and a longitudinal thickness 1 in a direction parallel to the longitudinal axis. The radial thickness r is greater than the longitudinal thickness 1. In the housing 15 a plurality of coils 21 (preferably superconducting coils) is provided for generating the uniform, steady magnetic field. In FIG. 2 only one coil 21 is shown. This type of magnet is generally known as a pancake magnet. The pancake magnet is known per se from EP-A-0 679 900 which corresponds to U.S. Pat. No. 5,428,292. The magnetic field generated by this type of magnet is homogeneous in a volume (the homogeneity volume) which lies at least in part in the bore 17. The shape and size of the homogeneity volume can be influenced by manipulating the number, the properties and the positions of the coils 21. As a rule, the magnet 1 is designed such that the homogeneity volume substantially coincides with the examination zone 3.

The apparatus further comprises an RF coil system for generating RF pulses and for receiving MR signals. In this embodiment, the RF coil system comprises a transmission coil for the transmission of RF pulses (not shown) and a synergy coil for receiving MR signals. The synergy coil comprises an array of surface coils 23 in which each surface coil overlaps at least a portion of one other surface coil. Such arrays of surface coils are known per se, for example from U.S. Pat. No. 4,825,162. The array of surface coils 23 extends over a ring-shaped surface surrounding the longitudinal axis 19 of the magnet 1. Preferably the surface coils 23 are arranged on the surface of the housing 15 that faces the bore 17.

Figure 4:
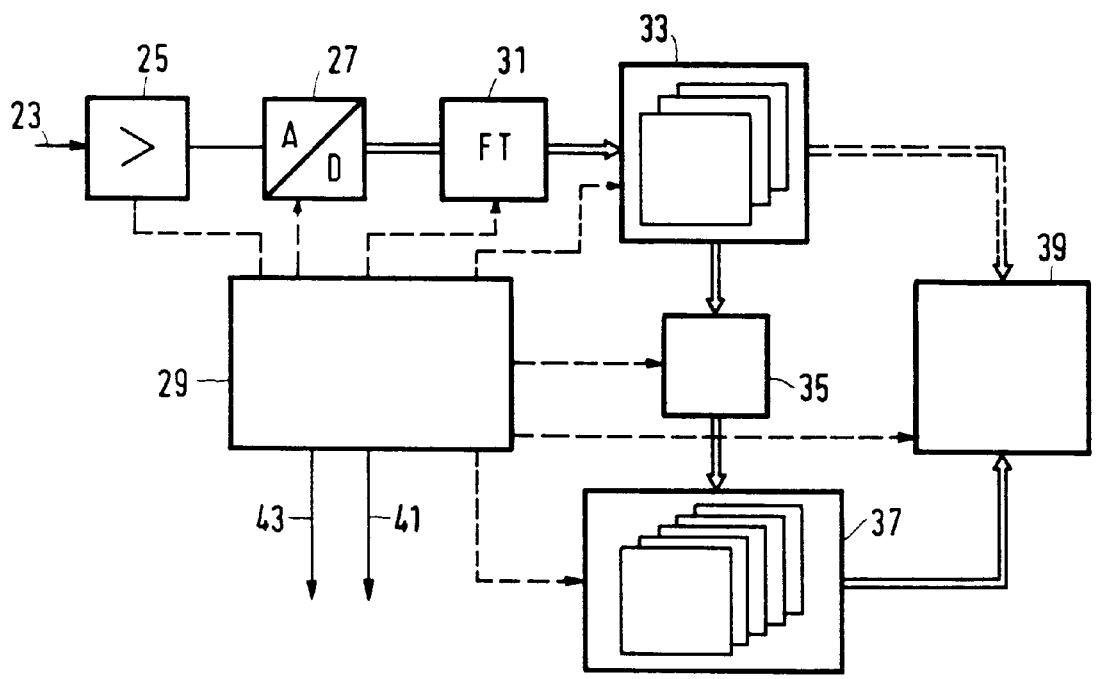
FIG. 4 shows a circuit diagram of the apparatus shown in FIG. 1.

FIG. 4 shows a circuit diagram of the apparatus shown in FIG. 1. The MR signals received by the array of surface coils 23 are amplified by a detection unit 25 and transposed in the baseband. The analog signal thus obtained is converted into a sequence of digital values by an analog-to-digital converter 27. The analog-to-digital converter 27 is controlled by a control unit 29 and succeeded by a Fourier transformation unit 31 which performs a one-dimensional Fourier transformation over the sequence of sampling values obtained by digitization of an MR signal, execution being so fast that the Fourier transformation is terminated before the next MR signal is received.

The raw data thus produced by Fourier transformation is written into a memory 33 whose storage capacity suffices for the storage of several sets of raw data. From these sets of raw data an interpolation unit 35 forms, in a manner described in detail in U.S. Pat. No. 5,498,961, sets of auxiliary data which are stored in a memory 37 whose storage capacity suffices for the storage of a large number of sets of auxiliary data. These sets of auxiliary data are calculated for different instants, the spacing of which is preferably small in comparison with the measurement period required for the acquisition of a set of raw data. A reconstruction unit 39, performing a filtered back-projection in known manner, produces MR images from the sets of raw data thus acquired, said MR images being stored. The MR images represent the examination zone at the predetermined instants. The series of the MR images thus obtained from the auxiliary data suitably reproduces the dynamic processes in the examination zone.

The units 25 to 39 are controlled by the control unit 29. As denoted by the downwards pointing arrow 41, the control unit 29 also serves to impose the variation in time of the currents in the gradient coil system 5 as well as the central frequency, the bandwidth and the envelope of the RF pulses generated by the RF coil system. The second downward pointing arrow 43 symbolizes a connection between the control unit 29 and the drive means 11 enabling the control unit to control the drive means.

The memories 33 and 37 as well as the MR image memory (not shown) in the reconstruction unit 39 can be realized by way of a single memory of adequate capacity. The Fourier transformation unit 31, the interpolation unit 35 and the reconstruction unit 39 can be realised by way of a suitable data processor.

Figure 5:
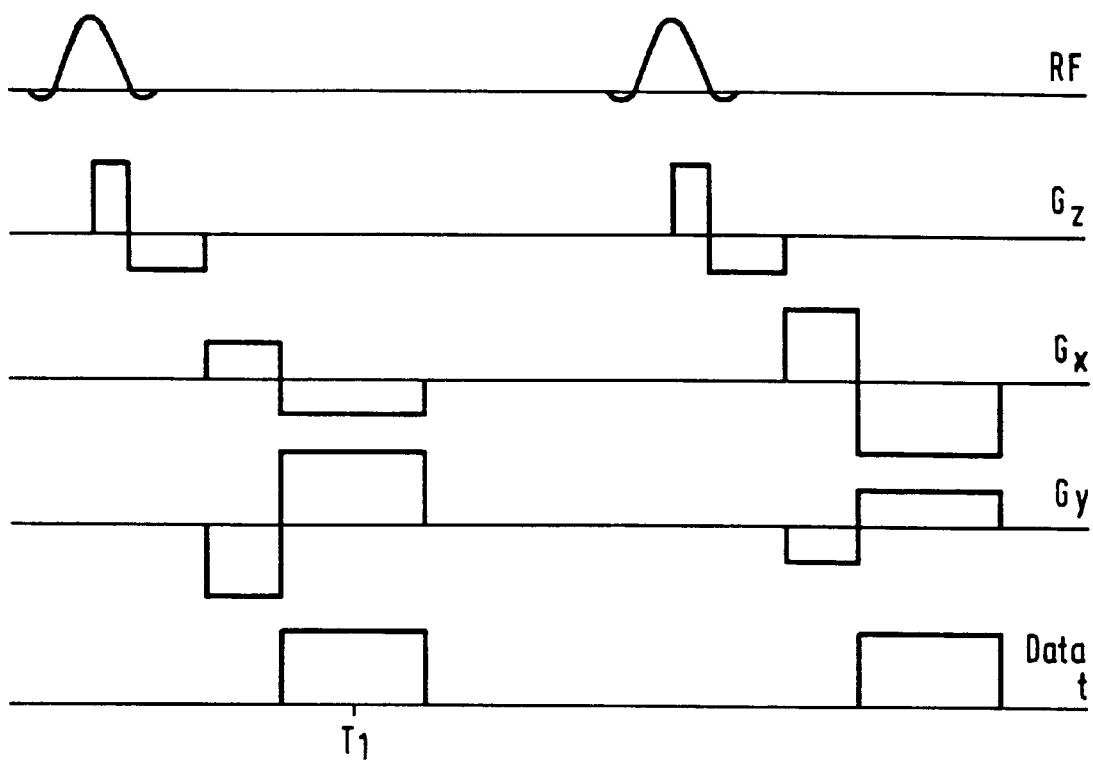
FIG. 5 is a diagram showing the progression in time of a sequence which is particularly useful for acquiring raw MR data with the apparatus shown in FIG. 1.

The described apparatus is very suitable for enhanced reproduction of an object which is moved relative to the examination zone, for example a patient 9 being displaced through the examination zone. During this displacement the apparatus of the invention produces a series of images with improved spatial resolution in the direction of displacement. During displacement of the table top 7 a plurality of series of sequences act on the examination zone, each series being composed of a number of sequences which may vary in time as shown in FIG. 5. A detailed explanation of these sequences can be found in EPA-0 615 135 and therefore they will only briefly be described here. The RF pulses (first line) accompanied by a gradient field (second line) extending in the z direction excite slices extending perpendicularly to the z direction.

Subsequently, magnetic gradient fields $G_x$ and $G_y$ are generated in conformity with the third and the fourth line of FIG. 2. The amplitude ratio of $G_x$ and $G_y$ is varied from one sequence to another, so that the magnetic gradient field formed by the superposition of $G_x$ and $G_y$ changes its direction $\phi$ in space from one sequence to another. Even though the slice-selective RF pulses excite the nuclear magnetization in a respective slice which is situated at the center of the examination zone and which is also referred to hereinafter as the measurement slice, the position of the patient 9, or the table top 7, relative to this slice changes due to the displacement of the table top. Consequently, each MR signal is dependent not only on the direction of the magnetic gradient field applied during its measurement but also on the relative position z of the patient 9, or the table top 7, relative to the measurement slice or the center of the apparatus.

Figure 6:
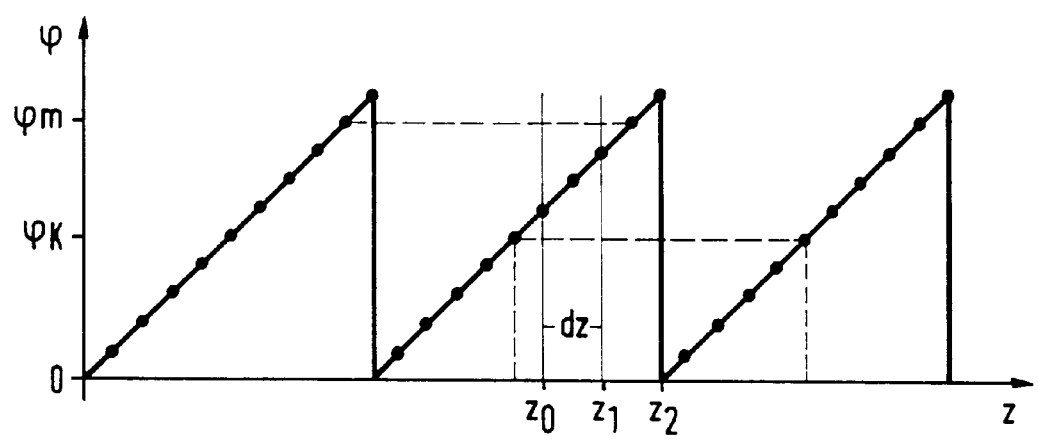
FIG. 6 shows the spatial assignment of measurement slices during the displacement of a patient in the examination zone of the apparatus shown in FIG. 1.

Thus, FIG. 6 shows the gradient direction $\phi$ as a function of the position z during acquisition of a plurality of sets of raw data, it being assumed that for each set of raw data the gradient direction is increased in steps. For any position of a slice, for example $z_0$, a set of auxiliary data can be derived from the sets of raw data by interpolation, the image of the relevant slice being reconstructed from said auxiliary data. This can be repeated for other slices having the positions $z_1$, $z_2$ etc., said slices being spaced $d_z$ apart.

When these slice images are time-sequentially displayed (for example with the same distance in time as the traversing of the positions $z_0$, $z_1$, $z_2$ etc. by the table top 7), an image sequence with high resolution in the z direction is obtained. Thus, the operator obtains an image sequence which resembles a film and in which the patient is "traversed" one slice after the other, so that a complete image of the patient 9 is obtained. Due to the small longitudinal dimension of the magnet 1, the patient remains fully accessible so that it is easy to perform other examinations besides MR or to apply interventional procedures. Moreover, the magnet 1 can be relatively cheap because it has only a relatively small homogeneity volume. This homogeneity volume can be even smaller in a further embodiment in which the drive means 11 is further conceived for displacement of the table top 7 in a direction perpendicular to the Z-direction, for example the X-direction. In that case the patient 9 can be moved through the homogeneity volume in two directions so that a full image of the patient is obtainable even if the cross-section of the patient exceeds the cross-section of the homogeneity volume.

The apparatus according to the invention is very useful for examining longitudinally extending parts of a patient 9, such as the aorta. A complete angiographic study of the aorta and peripheral vessels is possible by displacing the patient 9 over a distance of about 130 cm. For that particular type of examination only the part of the patient 9 below the shoulders would have to be moved through the homogeneity volume so that a homogeneity volume having a diameter of 40 cm and a thickness (longitudinal dimension) of 10 cm would be sufficient. A homogeniety volume having these dimensions can be achieved with a magnet 1 that is relatively short and has a relatively small bore in which the shoulders of the patient 9 do not fit. Such a magnet can be inexpensive. For examining extremities of a patient, an even smaller diameter of the homogeneity volume (down to 20 cm) can be used.

We claim:

1. A magnetic resonance (MR) apparatus for imaging a patient comprising:

a single magnet for generating in a homogeneity volume a uniform, steady magnetic field having substantially parallel lines of force extending in a first direction, wherein the magnet comprises a generally toroidal-shaped housing surrounding a bore said magnet having a longitudinal axis extending substantially parallel to said first direction, said housing having a radial thickness in a direction transverse to said axis and a longitudal thickness in a direction substantially parallel to said axis, said radial thickness being greater than said longitudinal thickness, a gradient coil system for generating a magnetic gradient field in the homogeneity volume whose gradient can be varied in respect of magnitude and/or direction, an RF coil system for generating RF pulses in and for receiving MR signals from the homogeneity volume, wherein the RF coil system comprises an array of coils for receiving MR signals, each coil overlapping at least a portion of at least one other coil, the array extending over a ring-shaped surface surrounding the longitudinal axis of the magnet, means for generating data from the MR signals, a reconstruction unit for reconstructing an MR image of the examination zone from a set of the data, patient support means comprising a table top and drive means for displacement of the table top in said first direction, a control unit for controlling said gradient coil system, said RF coil system, said means for generating data, said reconstruction unit, and said patient support means so that the patient is moved through the homogeneity volume during the receiving of MR signals and a plurality of cross-sectional images of the moving patient are reconstructed, and means for coupling said drive means and said control unit.

2. An MR apparatus as claimed in claim 1, wherein the homogeneity volume is substantially disc-shaped having a longitudinal axis substantially coinciding with the longitudinal axis of said magnet, and having a diameter that is at least twice its longitudinal thickness.

3. An MR apparatus as claimed in claim 2, wherein the diameter of the homogeneity volume is at least 40 cm, its longitudinal thickness being not more than 10 cm.

4. An MR apparatus as claimed claim 1, wherein the drive means is further configured for displacement of the table top in a direction substantially perpendicular to said first direction, and wherein the control unit controls said patient support means so that the plurality of cross-sectional images are obtained from a portion of the patient in the homogeneity volume.

5. An MR apparatus as claimed claim 2, wherein the drive means is further configured for displacement of the table top in a direction substantially perpendicular to said first direction, and wherein the control unit controls said patient support means so that the plurality of cross-sectional images are obtained from a portion of the patient in the homogeneity volume.

6. An MR apparatus as claimed claim 3, wherein the drive means is further configured for displacement of the table top in a direction substantially perpendicular to said first direction, and wherein the control unit controls said patient support means so that the plurality of cross-sectional images are obtained from a portion of the patient in the homogeneity volume.

7. The apparatus of claim 1 wherein the array of coils is arranged on the surface of the housing that faces the bore.

8. The apparatus of claim 1 wherein said control unit generates the plurality of cross-sectional images of a longitudinally extended part of the patient.

9. The apparatus of claim 8 wherein the longitudinally extended part of the patient is the aorta of the patient.

* * * * *